(12) United States Patent
Yang et al.

(10) Patent No.: US 7,728,395 B2
(45) Date of Patent: Jun. 1, 2010

(54) MICRO-MECHANICAL STRUCTURE AND METHOD FOR MANUFACTURING THE SAME

(75) Inventors: Woo Seok Yang, Daejeon (KR); Sung Weon Kang, Daejeon (KR); Youn Tae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 732 days.

(21) Appl. No.: 11/596,343

(22) PCT Filed: Dec. 20, 2004

(86) PCT No.: PCT/KR2004/003360

§ 371 (c)(1),
(2), (4) Date: Nov. 14, 2006

(87) PCT Pub. No.: WO2005/124869

PCT Pub. Date: Dec. 29, 2005

(65) Prior Publication Data

US 2007/0215965 A1    Sep. 20, 2007

(51) Int. Cl.
*H01L 29/84* (2006.01)

(52) U.S. Cl. .......... 257/415; 257/E21.52; 257/E29.324; 438/52

(58) Field of Classification Search ................. 257/415, 257/E29.167, E29.324, E21.52; 438/50–52; 427/250

See application file for complete search history.

(56) References Cited

U.S. PATENT DOCUMENTS

| 6,020,215 | A | * | 2/2000 | Yagi et al. ..................... 438/52 |
| 6,238,580 | B1 | | 5/2001 | Cole et al. |
| 6,372,700 | B1 | * | 4/2002 | Zazerra et al. .............. 510/175 |
| 6,806,205 | B2 | | 10/2004 | Jang et al. |
| 2002/0058422 | A1 | | 5/2002 | Jang et al. |
| 2002/0155299 | A1 | * | 10/2002 | Harris et al. ................ 428/428 |

FOREIGN PATENT DOCUMENTS

| JP | 10107339 | | 4/1998 |
| JP | 2003200394 | | 7/2003 |
| KR | 20020037088 | | 5/2002 |
| WO | WO/03/055788 | | 7/2003 |
| WO | 03/071334 | A1 | 8/2003 |
| WO | 03/055789 | A1 | 10/2003 |

OTHER PUBLICATIONS

Hoivik et al. "Atomic layer deposited protective coatings for microelectromechanical systems." Sensors and Actuators A 103 (2003) 100-108.*

(Continued)

*Primary Examiner*—Minh-Loan T Tran
*Assistant Examiner*—W. Wendy Kuo
(74) *Attorney, Agent, or Firm*—Ladas & Parry LLP

(57) ABSTRACT

Provided is a micro-mechanical structure and method for manufacturing the same, including a hydrophilic surface on at least a part of a surface of the micro-mechanical structure, so as to prevent generation of an adhesion phenomenon in the process of removing a sacrificial layer to release the micro-mechanical, wherein the sacrificial layer comes into contact with the surface of the micro-mechanical structure.

16 Claims, 7 Drawing Sheets

OTHER PUBLICATIONS

International Search Report mailed Mar. 24, 2005; PCT/KR2004/003360.

Yang, Woo Seok, et al., "A new Surface Modification Method to Prevent the Release-Stiction of Micromechanical Structures During HF Vapor-Phase Etching", Sep. 9, 2004, *Japanese Journal of Applied Physics*, vol. 43, No. 9A, pp. 6008-6011.

Lee, Yong-Ii, et al., "Dry Release for Surface Micromachining with HF Vapor-Phase Etching", Sep. 1997, *Journal of Microelectromechanical Systems*, vol. 6, No. 3, pp. 226-233.

Offenberg, M., et al., "Vapor HF Etching for Sacrificial Oxide Removal in Surface Micromachining", R. Bosch GmbH Corporate Research.

* cited by examiner

[Fig. 1] (PRIOR ART)
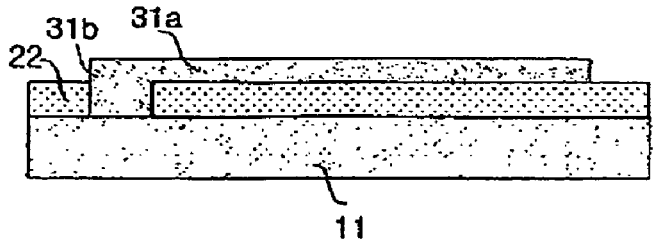
[Fig. 2] (PRIOR ART)
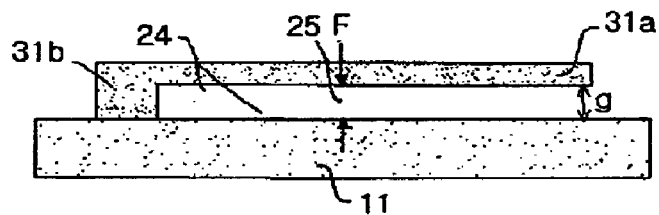
[Fig. 3] (PRIOR ART)
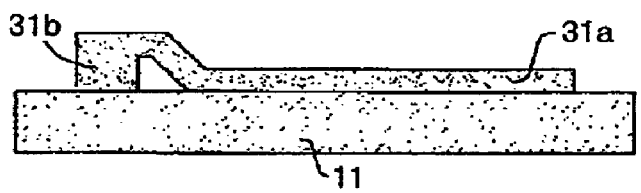
[Fig. 4]
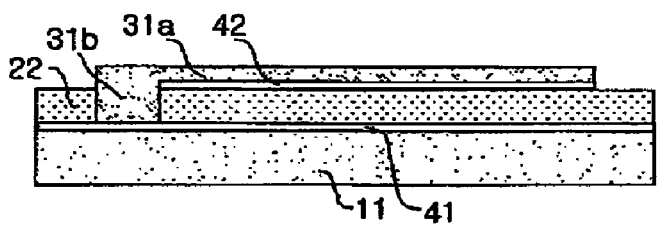
[Fig. 5]
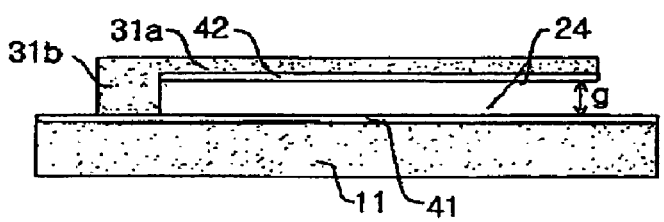
[Fig. 6]
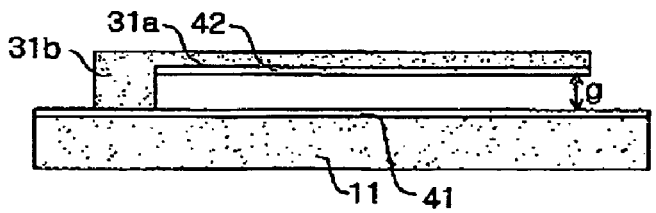

[Fig. 7]
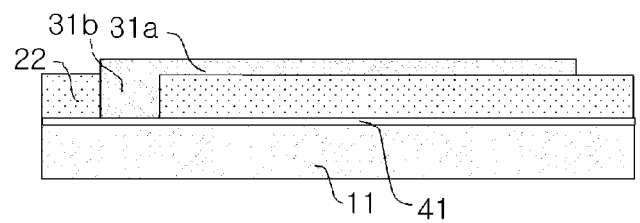
[Fig. 8]
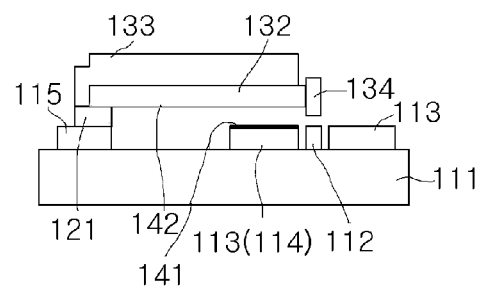
[Fig. 9]
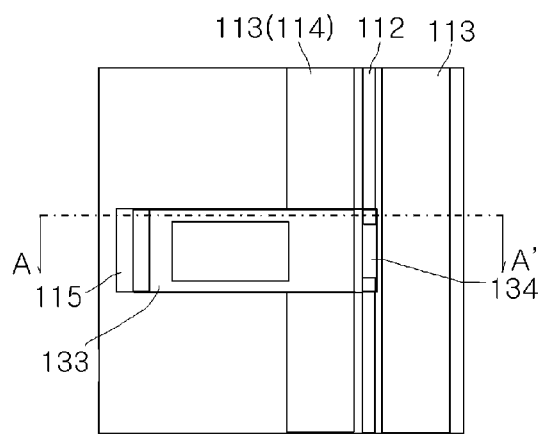
[Fig. 10]
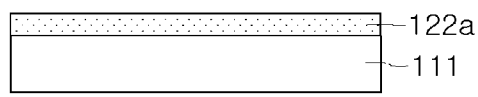
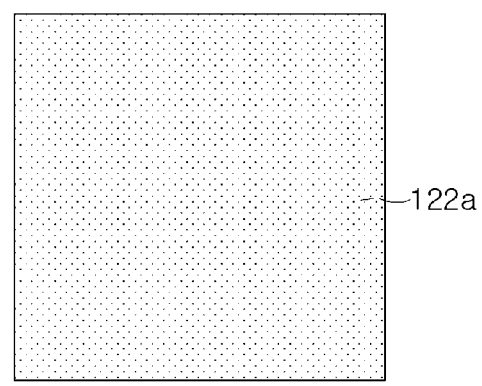

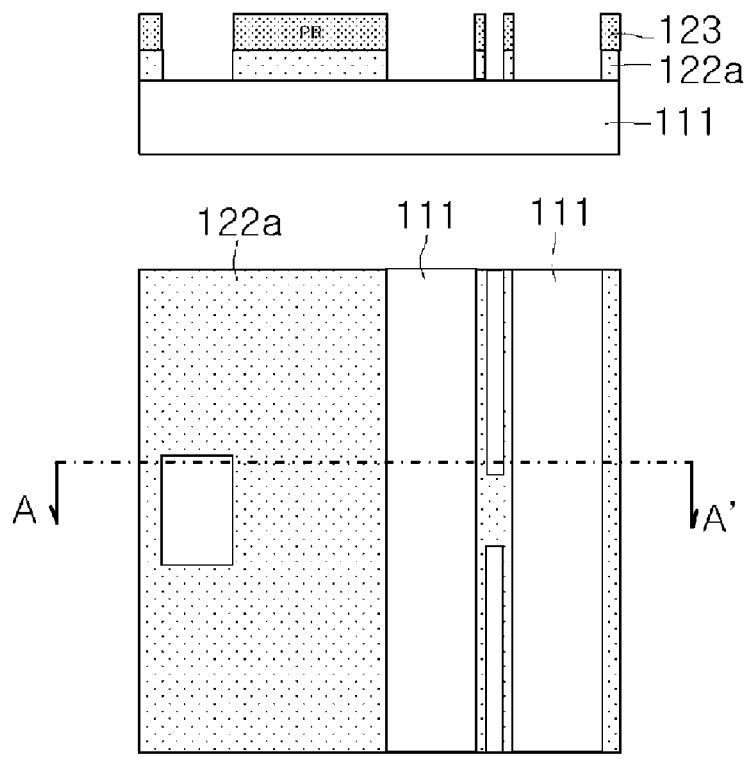
[Fig. 11]
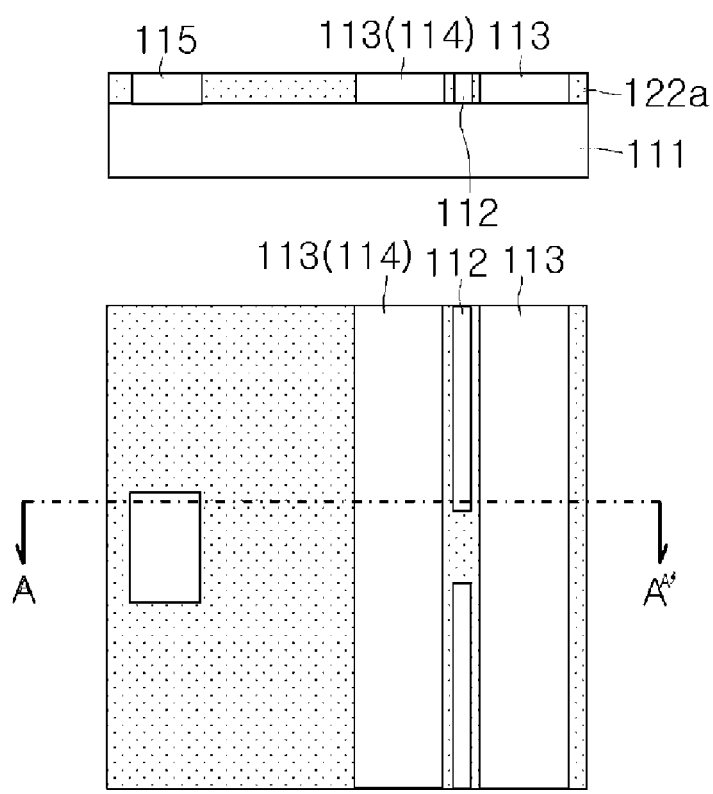
[Fig. 12]

[Fig. 13]
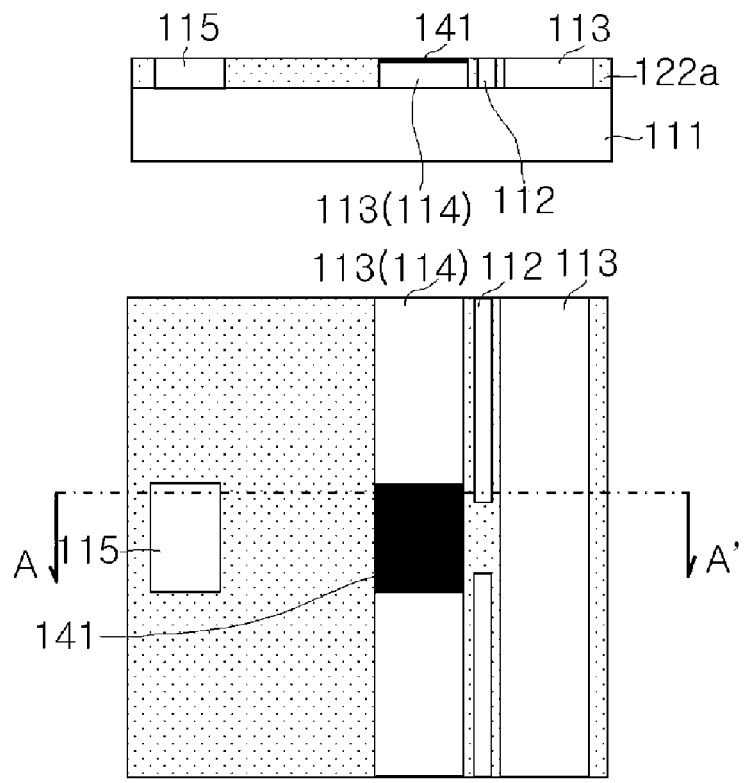
[Fig. 14]
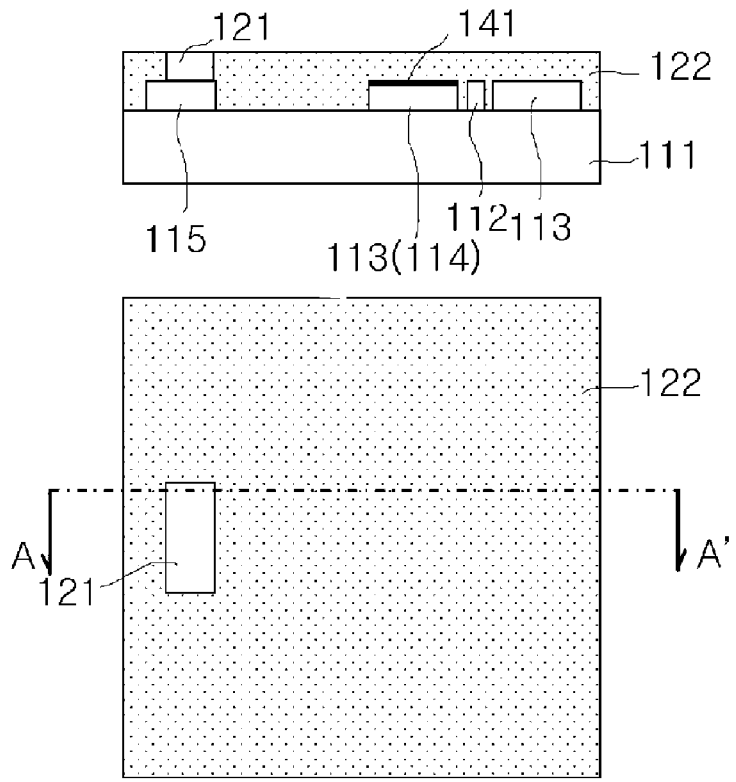

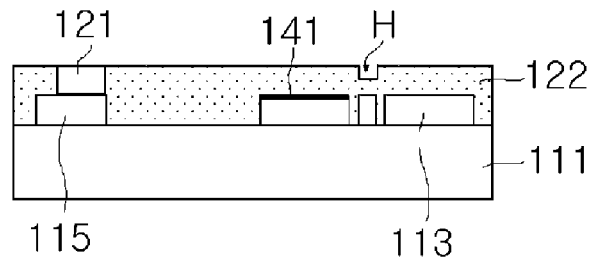
[Fig. 15]
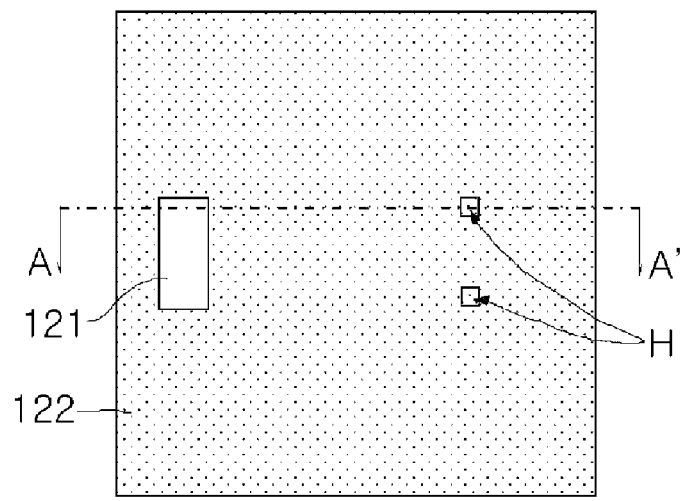
[Fig. 16]
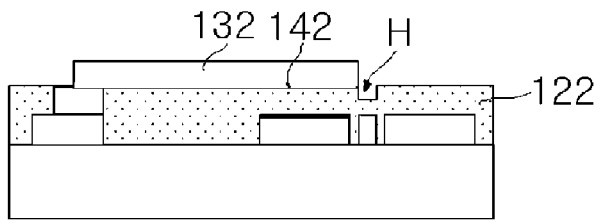
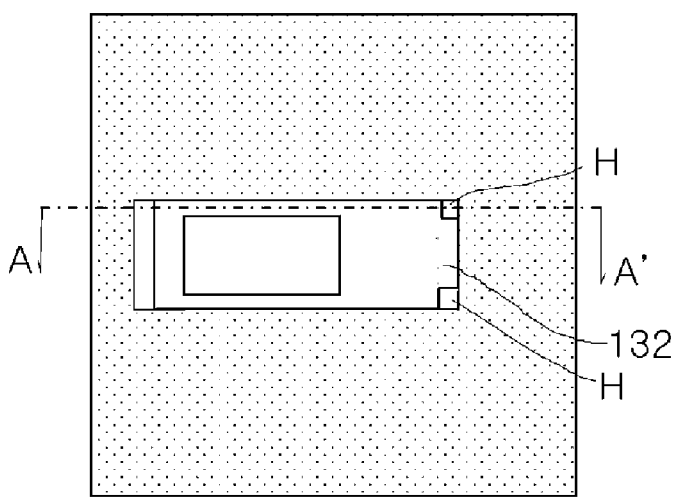

[Fig. 17]
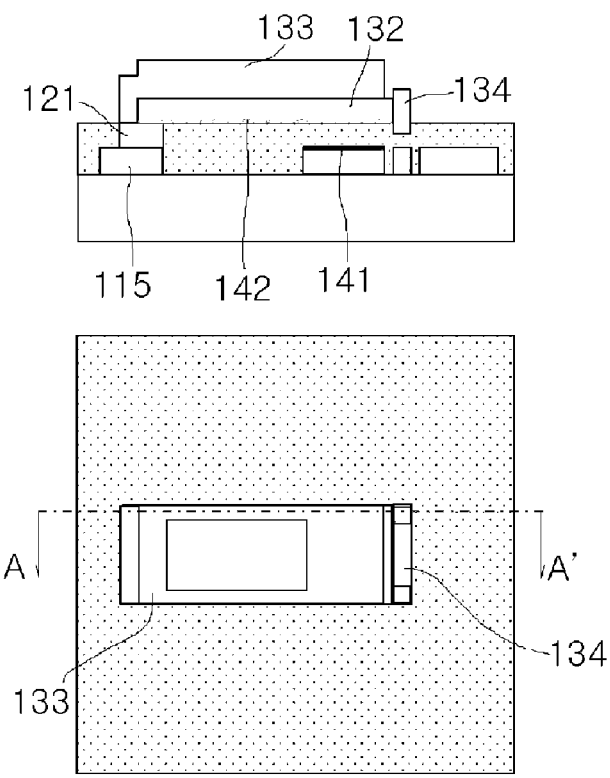
[Fig. 18]
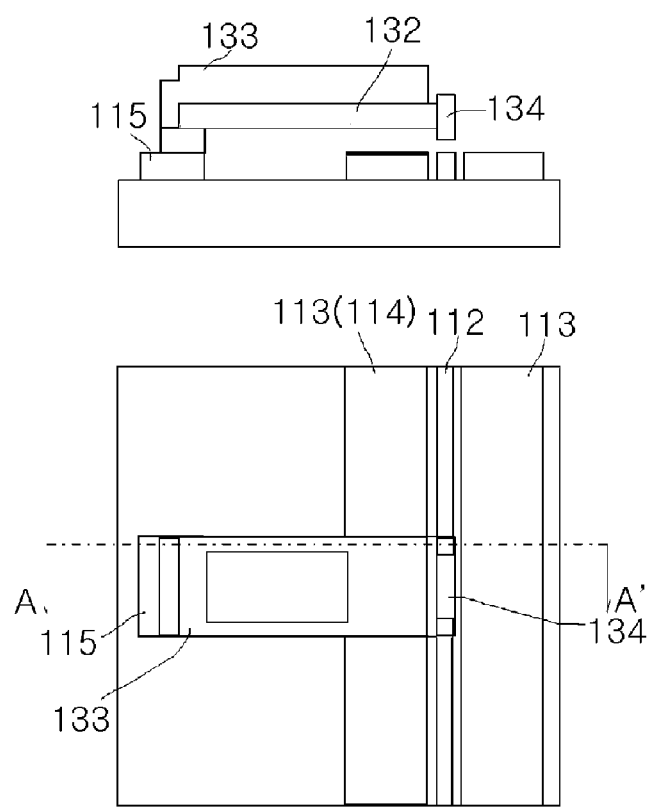

[Fig. 19]
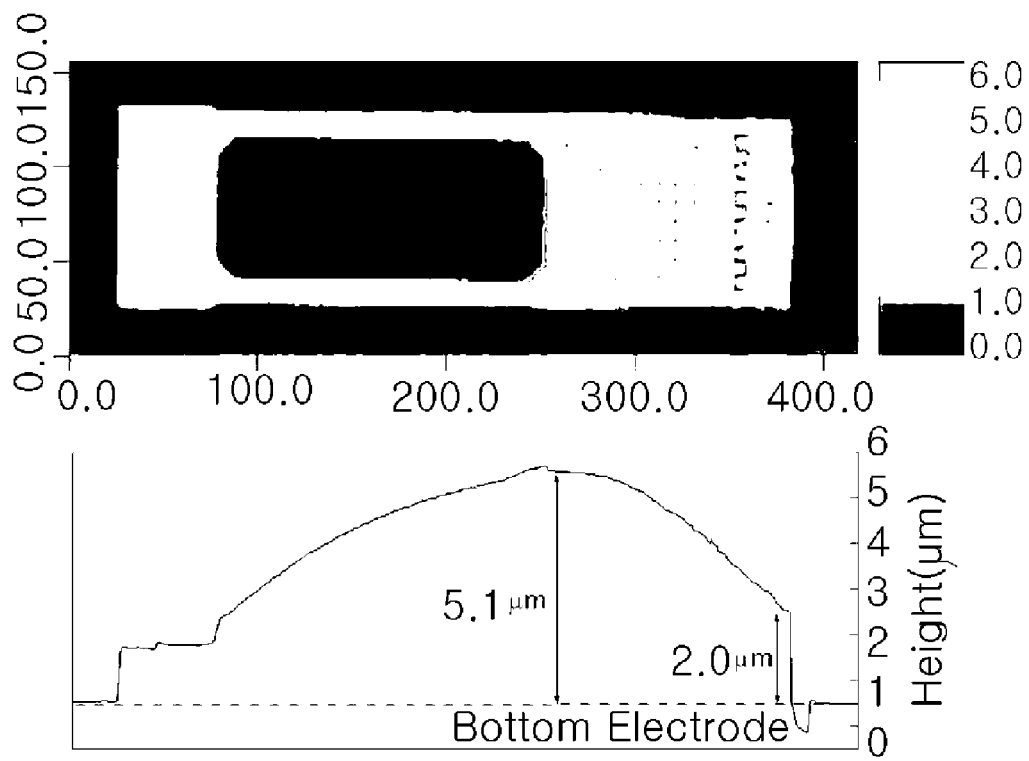
[Fig. 20]
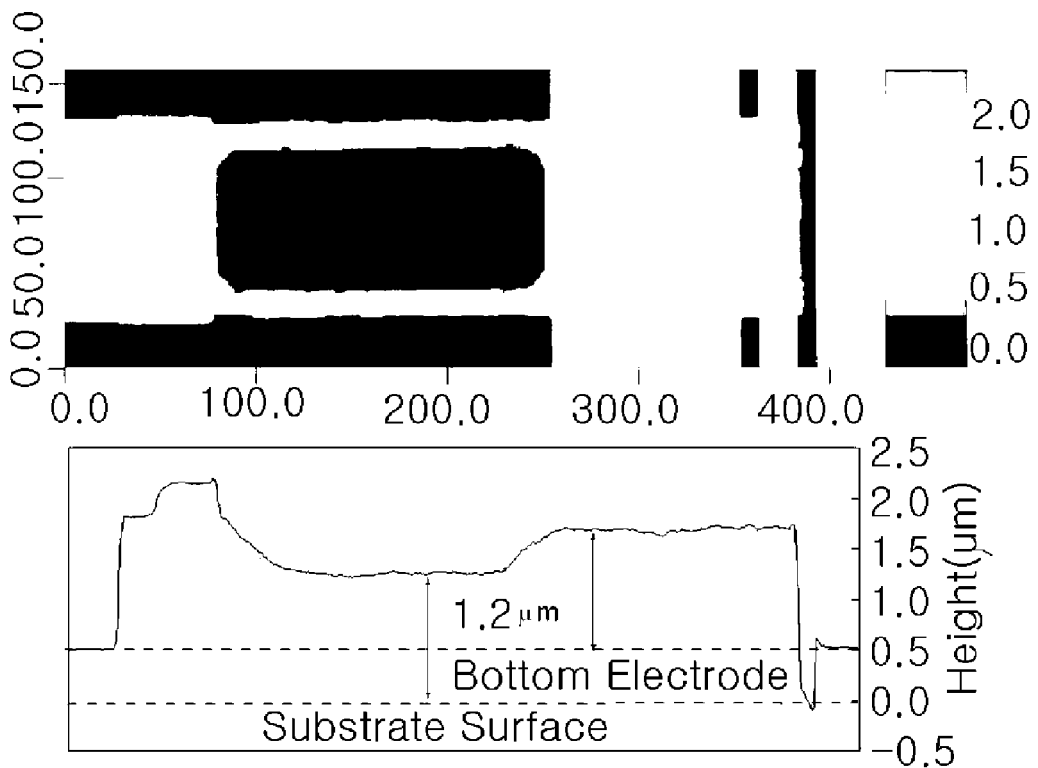

MICRO-MECHANICAL STRUCTURE AND METHOD FOR MANUFACTURING THE SAME

BACKGROUND ART

1. Field of the Invention

The present invention generally relates to a micro-mechanical structure and a method for manufacturing the same, and more particularly, to a micro-mechanical structure, of which at least a part is configured of a hydrophilic surface in contact with a sacrificial layer to be removed, in order to prevent the micro-mechanical structure from being stuck in the step of removing the sacrificial layer to release the micro-mechanical structure.

2. Discussion of Related Art

Conventionally, micro-mechanical elements are produced by forming a micro-mechanical structure through a surface micro-machining process, that is, through repetitive vapor-deposition and selective etching processes of a structural layer and a sacrificial layer, and then removing only the sacrificial layer to form an air-gap, thus releasing the micro-mechanical structure.

The micro-mechanical structure is vulnerable to an interfacial force and the resulting adhesion, because of a relatively wide surface area in comparison with its volume, and a relatively narrow gap from the neighboring surface. Thus, there occurs a problematic adhesion phenomenon in the process of removing the sacrificial layer to release the micro-mechanical structure. For this reason, preventing such an adhesion phenomenon is very important for improvement of characteristics and yield of the element [References: Tas et al., "Stiction in surface micro-machining," J. Micromech. Microeng., vol. 6, pp. 385-397, 1996; and Maboudian et al., "Critical Review: Adhesion in surface micro-mechanical structures," J. Vac. Sci. Technol. B, vol, 15, no. 1, pp. 1-20, January/February. 1997]. Especially, water produced in the process of etching the sacrificial layer to release the micro-mechanical structure is known to cause the adhesion phenomenon of the micro-mechanical structure. This problem will be described below in detail, taking the most general case of using silicon oxide for the sacrificial layer and etching the sacrificial layer with hydrogen fluoride (HF) by way of an example.

In the case of etching the silicon oxide sacrificial layer through a chemical etching process employing HF, the process can be subdivided into a liquid-phase etching process and a vapor-phase etching process according to the state of HF. The vapor-phase etching process, which is developed posterior to the liquid-phase etching process, has much larger industrial utility because of the advantages of: 1) less occurrence of the adhesion phenomenon; 2) high productivity caused by omission of de-ionized water rinsing and drying processes followed in the liquid-phase etching process; and 3) low cost due to use of small amount of a high purity of HF which is expensive and causes environmental pollution.

In the vapor-phase etching process employing HF, a mixture of a HF gas as a reacting gas, and a water vapor or alcoholic gas serving as a catalyst for chemical reaction is generally used [References: U.S. Pat. No. 6,238,580 B1, filed on December 1999, Cole et al.; U.S. Patent Publication No. 2002/0058422 A1, filed on December 2000, Jang et al.]. Methyl alcohol having an evaporation point (64.5° C.), lower than that (100° C.) of water vapor is more used than the water vapor, because the former is effective to prevent the adhesion phenomenon.

On the other hand, the reaction of the silicon oxide sacrificial layer and the HF gas results in silicon fluoride ($SiF_4$) and water ($H_2O$), as in Formula 1. In this case, silicon fluoride having a low evaporation point (−94.9° C.), is discharged in a gas state, while, in the case of water having a high evaporation point (100° C.), some x is discharged in a vapor state, and the remnant 2−x is condensed and left behind in a liquid state [Reference: Helms et al., "Mechanisms of the HF/$H_2O$ vapor phase etching of $SiO_2$."].

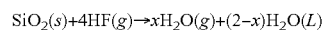

$$SiO_2(s) + 4HF(g) \rightarrow xH_2O(g) + (2-x)H_2O(L) \qquad \text{Formula 1.}$$

FIGS. 1 to 3 are conceptual views for explaining a micro-mechanical structure where an adhesion phenomenon occurs in the conventional process of removing the silicon oxide sacrificial layer through the HF vapor-phase etching process.

A sample is prepared by forming, on a substrate 11, a silicon oxide sacrificial layer 22 and micro-mechanical structures 31a and 31b taking a cantilever shape. A HF vapor-phase etching process is performed to the sample, so that an air-gap g is formed by removal of the silicon oxide sacrificial layer 22. At this point, water in a liquid state is formed in a shape of islands 24 at a contact angle of θc<90° on surfaces of the substrate 11 and the micro-mechanical structures 31a and 31b, both of which are formed of a hydrophilic material. Some of the water islands 24 get in contact with each other, thereby building up a water bridge 25 connecting the substrate 11 and the micro-mechanical structures 31a and 31b. In this situation, the water bridge causes a capillary force F, as expressed in Equation 1, to be exerted between the substrate and the micro-mechanical structure.

$$F = \frac{2A\gamma_{la}\cos\theta_c}{g} \qquad \text{Equation 1}$$

wherein, g is the height of the water bridge, namely, the thickness of air-gap, $\gamma_{la}$ is the surface tension of water in the air, and θc is the contact angle of water on a solid surface.

In this case, the capillary force has a positive value, that is, serves as an attractive force, because θc is less than 90°. If the capillary attraction becomes larger than the co-efficient of elasticity which is required to deform the micro-mechanical structure, the micro-mechanical structures 31a and 31b are bent to the substrate, thereby sticking temporarily to it. Then, even when all the liquefied water is evaporated, no air-gap g remains between the substrate 11 and the micro mechanical structures 31a and 31b. Accordingly, both of them are permanently stuck by a van der Waals force acting between them.

As described above, the liquefied water, which remains on the substrate and the micro-mechanical structure, causes a problem that the micro-mechanical structure sticks to a base structure such as the substrate [References: Offenberg et al., "Vapor HF etching for sacrificial oxide removal in surface micromachining, Electrochemical Soc. Fall Meet., vol. 94, no. 2, pp. 1056-1057, October 1994; Lee et al., "Dry release for surface micromachining with HF vapor-phase etching," J. MEMS, vol. 6, no 3, September 1997]. To prevent the liquefied water from being generated, the temperature of the substrate should be increased, while the pressure of reaction should be decreased. However, this remarkably reduces an etching speed of silicon oxide, which results in great reduction in productivity.

SUMMARY OF THE INVENTION

The present invention is directed to a method of solving an adhesion problem of a micro-mechanical structure, which occurs due to water produced in a HF etching process for removing a sacrificial layer while micro-mechanical elements are manufactured.

Further, the present invention is directed to a method of manufacturing a micro-mechanical structure having a thin air-gap g from a base structure and a small co-efficient of elasticity at a high productivity.

One aspect of the present invention is to provide a micro-mechanical structure released by removing a sacrificial layer comprising: a first side portion fixed on one region of an upper surface of a base structure; and a second side portion released by removal of the sacrificial layer, the second side portion having an opposite surface to the upper surface, wherein the upper surface and the opposite surface include at least a hydrophilic surface to maintain a contact angle of water produced during removal of the sacrificial layer to be less than 90°, and to prevent the produced water from building up a water bridge which causes adhesion of the micro-mechanical structure.

Preferably, the upper surface may be a surface of a hydrophilic layer which is additionally formed on the base structure, and the opposite surface may be a surface of a hydrophilic layer which is additionally formed on the micro-mechanical structure.

The upper surface and the opposite surface may be formed of hydrophilic layers of materials equal to or different from each other.

The hydrophilic layer, in case that the sacrificial layer is, for example, a silicon oxide sacrificial layer, is preferred to have characteristics of not being etched by an HF gas. Further, the hydrophilic layer may be formed of any one selected from the group consisting of aluminum (Al), titanium (Ti), chromium (Cr), iron (Fe), cobalt (Co), aluminum oxide, chromium oxide, iron oxide, and cobalt oxide.

Another aspect of the present invention provides a method for manufacturing a micro-mechanical structure comprising: providing a base structure having an upper surface; forming a sacrificial layer on the base structure; forming the micro-mechanical structure having a first side portion fixed on an upper surface of the base structure, and a second side portion to be released by removing the sacrificial layer, the second side portion having an opposite surface opposite to the upper surface; and releasing the micro-mechanical by removing the sacrificial layer, wherein the sacrificial layer is removed by etching in such a way that a contact angle of water produced during removal of the sacrificial layer is less than 90°, and that the produced water does not build up a water bridge which causes adhesion of the micro-mechanical structure.

The etching of the sacrificial layer may be preferably performed at a temperature between about 25° C. and about 45° C. by using a mixture of an HF reacting gas, an alcoholic catalytic gas ($CH_3OH$, $C_2H_5OH$, etc.) and a carrier gas for carrying the catalytic gas ($N_2$, Ar, etc.).

Another aspect of the present invention provides a micro-mechanical structure released by removing a sacrificial layer comprising: a first side portion fixed on an upper surface of a base structure; and a second side portion released by removing the sacrificial layer, the second side portion having an opposite surface opposite to the upper surface, wherein at least one of the upper surface and the opposite surface further includes a hydrophilic layer formed of any one selected from the group consisting of aluminum (Al), titanium (Ti), chromium (Cr), iron (Fe), cobalt (Co), aluminum oxide, chromium oxide, iron oxide, and cobalt oxide.

BRIEF DESCRIPTION OF THE DRAWINGS

The foregoing and other objects, features and advantages of the invention will be apparent from the more particular description of a preferred embodiment of the invention, as illustrated in the accompanying drawing. The drawing is not necessarily to scale, emphasis instead being placed upon illustrating the principles of the invention.

FIGS. 1 through 3 are cross-sectional views of a micro-mechanical structure for an illustration of an adhesion phenomenon which occurs in a conventional process of HF vapor-phase etching for removing a silicon oxide sacrificial layer.

FIGS. 4 through 6 are cross-sectional views of a micro-mechanical structure for explanation of a micro-mechanical according to an embodiment of the present invention.

FIG. 7 is a cross-sectional view of a micro-mechanical structure according to another embodiment of the present invention.

FIGS. 8 and 9 are a cross-sectional view and a plan view of a micro-mechanical switch according to a preferred embodiment of the present invention, respectively.

FIGS. 10 through 18 are cross-sectional views for illustrating an exemplary process of manufacturing a micro-mechanical switch according to a preferred embodiment of the present invention.

FIGS. 19 and 20 illustrate a plan picture and a graph obtained by a 3D surface profiling system of a micro-mechanical switch formed by using a hydrophilic layer and without using a hydrophilic layer respectively.

DETAILED DESCRIPTION OF PREFERRED EMBODIMENTS

Hereinafter, a micro-mechanical structure of a preferred embodiment according to the present invention will be described in reference with FIGS. 4 through 6. FIGS. 4 through 6 are conceptual views for explaining a micro-mechanical structure according to an embodiment of the present invention.

Micro-mechanical structures 31a and 31b are those released by removal of a sacrificial layer, which are configured in such a way that any one 31b of them is fixed on an upper surface of a base structure 11, and the other 31a is released by removal of the sacrificial layer. Surfaces of the micro-mechanical structure 31a, which is opposite to the upper surface of the base structure 11, is configured of strong hydrophilic surface in such a way that a contact angle of water produced during removal of the sacrificial layer is less than 90°, and that the produced water does not build up a water bridge connecting the surfaces opposite to each other.

The hydrophilic surface of the base structure 11 may be a surface of the base structure itself, or a surface of a first hydrophilic layer 41 which is additionally formed on the base structure 11. Similarly, the hydrophilic surface of the micro-mechanical structure 31a may also be surface of the micro-mechanical structure itself, or a surface of a second hydrophilic layer 42 which is additionally formed on the micro-mechanical structure 31a. Meanwhile, the upper surface and the opposite surface may be configured of hydrophilic layers of materials equal to or different from each other. Preferably, each of the additional hydrophilic layers is formed in a shape of a thin film of aluminum (Al), titanium (Ti), chromium (Cr), iron (Fe), cobalt (Co), aluminum oxide, chromium oxide, iron oxide, or cobalt oxide, with a thickness of 5-100 nm. In this case, if the base structure 11 is made of, for example, aluminum (Al), the base structure 11 itself has the hydrophilic surface.

As described above, FIGS. 4 through 6 illustrate, by way of an example, but not limited to, the case that both the first hydrophilic layer 41 of the base structure 11 and the second hydrophilic layer 42 of the micro-mechanical structures 31a and 32b are additionally formed. Further, FIG. 7 illustrates a configuration that only the first hydrophilic layer 41 is additionally formed on the upper surface of the base structure 11.

According to the present invention, water in a liquid state, which is condensed in the process of removing the sacrificial layer 22, is formed of wide and low islands 24 on the surface of the strong hydrophilic layer at a small contact angle. Such islands do not build up a water bridge. Therefore, the capillary force is not exerted between the base structure 11 and the micro-mechanical structure 31a. Moreover, even when all the liquefied water is evaporated, the micro mechanical structure 31a maintain a constant gap g from the base structure 11, so that no adhesion phenomenon is basically generated.

In other words, as described with Equation 1, the capillary force has a positive value, that is, acts as an attractive force, because θc is less than 90°. However, according to the present invention, the adhesion phenomenon of the micro-mechanical structure 31a is basically prevented by suppressing the generation of the water bridge.

According to Equation 1, the attractive force cannot be generated by maintaining the contact angle of water θc formed on the surface of the base structure 11 and on the opposite surface of the micro-mechanical structure 31a to be more than 90°. In the case of θc>90°, the capillary force exerted by the water bridge connecting the surface of the base structure and the micro-mechanical structure 31a becomes a negative value, that is, acts as a repulsive force. As a result, although the liquefied water is evaporated, the micro mechanical structure 31a continues to maintain the constant gap from the base structure 11, and thus the micro-mechanical structure can be normally released.

However, to maintain this contact angle of water, the surface of the base structure and the opposite surface of the micro-mechanical structure should be formed of a hydrophobic material, not a hydrophilic material. Generally, the hydrophobic material may include a polymer material, such as self-assembled monolayer (SAM), fluorocarbon (FC) or so forth. But, such a material is in difficulties for practical application on manufacturing the micro-mechanical structures, because of problems of weak adhesion to other materials, low thermal instability, and decrease of hydrophobic property under the oxide atmosphere. Typically, in most cases of manufacturing the micro-mechanical structures, the hydrophilic material, such as silicon (Si), silicon nitride ($Si_3N_4$), gold (Au), or aluminum (Al), is used.

In terms of measured contact angle of the hydrophilic material which is removed by a HF vapor-phase etching process after vapor deposition of silicon oxide, the contact angles of aluminum, titanium, chromium and aluminum oxide are 17°, 8°, 23° and 5° respectively, all of which materials have a strong hydrophilic property.

Preferably, the sacrificial layer is formed of silicon oxide. For example, the sacrificial layer may employ silicon oxide (e.g., thermal oxide, thermal chemical vapor deposition (CVD) oxide, plasma enhanced chemical vapor deposition (PECVD) oxide, spin-on glass (SOG), sputtered oxide or evaporated oxide), phosphosilicate glass (PSG), or boron-phosphorous-silicate glass (BPSG).

In the case of using silicon oxide as the sacrificial layer to be removed, the HF vapor-phase etching process is performed at a temperature between about 25 and 45° C. by using a mixture containing a HF reaction gas, an alcoholic catalytic gas (e.g., $CH_3OH$, $C_2H_5OH$, etc.) and a carrier gas for carrying the catalytic gas (e.g., $N_2$, Ar, etc.). In this case, the hydrophilic materials, such as Si and Au, are not chemically etched by the HF reaction gas. When the sacrificial layer is removed by the HF vapor-phase etching process after the vapor deposition of silicon oxide, the measured contact angle of water is within the range between about 50 and 80°. Such a contact angle is possibly satisfying requirements for adhesion of the surface of the base structure and the opposite surface of the micro-mechanical structure.

Hereinafter, the present invention will be described in more detail about elements to which the micro-mechanical structures are applicable, in particular, a micro-mechanical switch by way of an example. FIGS. 8 and 9 are a cross-sectional view and a plan view of a micro-mechanical switch according to a preferred embodiment of the present invention, respectively. The micro-mechanical switch is a resistive radio frequency micro-mechanical switch driven by an electrostatic force.

The micro-mechanical switch is comprised of: a signal line 112 formed on the substrate 111 in such a way that input and output terminals are separated; ground lines 113 formed on opposite sides of the signal line 112; a lower electrode 114 formed of any one of the ground lines 113; a bias electrode 115; a post 121 formed on the bias electrode 115; a moving plate 132 formed in a cantilever shape that one end is fixed on a substrate 111 by the post 121 and the silicon oxide sacrificial layer (not shown) surrounding the post 121 and that a body comes into contact with the signal lines 113 and the lower electrode 114 with a silicon oxide sacrificial layer (not shown) of a pre-determined thickness interposed between the lower electrode 114 and the moving plate 132; an upper electrode 133 formed on the moving plate 132 to be symmetric with respect to the lower electrode 114; and a contact pad 134 formed on the unfixed other end of the moving plate 132 to be symmetric with respect to an open gap of the signal line 112.

Meanwhile, a first hydrophilic layer 141 of Al or Ti is formed on at least a part of the upper surface of the lower electrode 114 which is formed of Au, for example. A second hydrophilic layer 142 of aluminum oxide ($Al_2O_3$) is formed on the bottom surface of the moving plate 132 which is formed of silicon. The materials such as Al and Ti are all conductive metals like Au forming the lower electrode 114. The material such as aluminum oxide is a good insulating material like Si. Therefore, the formation of the hydrophilic layers does not affect operation of the switch.

The first and second hydrophilic layers 141 and 142 serve not only to maintain the contact angle of water produced when the silicon oxide sacrificial layer is removed by the etching process to be less than 90°, but also to prevent the produced water from building up the water bridge connecting between the first and second hydrophilic layers 141 and 142.

Then, an operation of the resistive radio frequency micro-mechanical switch driven by electrostatic force will be described below. First, when a predetermined voltage is applied to the bias electrode 115, so the electrostatic force is generated between the upper electrode 133 electrically connected to the bias electrode 115 and the lower electrode 114 being in a ground state. The upper electrode 133 and the moving plate 132 are then bent toward the substrate 111 by the electrostatic force. Then, the contact pad 134 is brought into contact with and connects the input and output terminals of the signal line 112 at the same time, so that a signal is transferred.

Because a low drive voltage is required to expand applicability of the switch, it is important to make a gap between the lower electrode 114 and the upper electrode 133 narrow. Once the voltage applied to the bias electrode 115 is cut off, the moving plate 132 and the upper electrode 133 which have been bent are linearly restored to their original shapes by an elastic restoring force. Then, the contact pad 134 is detached from the signal line 112, so that the signal is no longer transferred.

Meanwhile, the following materials are generally used to manufacture the resistive radio frequency micro-mechanical switch driven by electrostatic force: semi-insulating GaAs for the substrate 111, Au for the signal line 112, the ground line 113 and the contact pad 134 which has good electrical conductivity, undoped-silicon for the moving plate 132 which has chemical stability during the HF vapor-phase etching process and a good electrical insulating property, and conductive metal material for the bios electrode 115, the post 121 and the upper electrode 133.

An example of the method of manufacturing the micro-mechanical switch according to the preferred embodiment of the present invention will be described with reference to FIGS. 10 through 18.

Referring to FIGS. 10 and 11, a silicon oxide sacrificial layer 122a is deposited on a GaAs substrate 111 by using a vapor deposition process, such as plasma enhanced chemical vapor deposition (PECVD), radio frequency sputtering, and E-beam evaporation. Then, a negative photoresist layer 123 is coated on the silicon oxide sacrificial layer 122a. A patterning process is performed to define predetermined areas (i.e., a signal line, a ground line, a bias electrode, etc.) by using a photo lithography process. The silicon oxide sacrificial layer 123 is then removed by using reactive ion etching (RIE), so that the substrate 111 is exposed.

Referring to FIG. 12, after deposition of Au electrode layers 112, 113, 114 and 115 by using E-beam evaporation, the photoresist layer 123 and the Au electrode layers formed on the photoresist layer are simultaneously removed by using a lift-off process. This etching results in formation of a trench pattern of silicon oxide ($SiO_2$), within which the Au electrode layers 112, 113, 114 and 115 are formed. In this case, a titanium layer (not shown) may be formed between the Au electrode layers 112, 113, 114 and 115 and the GaAs substrate 111 to enhance adhesion.

Referring to FIG. 13, after defining a part of the region of the ground line 113 (i.e., the region of the lower electrode 114) through the coating and patterning processes of the photoresist layer 123, the first hydrophilic layer 141 having the hydrophilic surface is formed by using Ti (or Al, Cr, etc.) evaporation or lift-off process.

Referring to FIG. 14, an additional silicon oxide layer is formed on the previously formed silicon oxide 122a to form a silicon oxide layer 122, and then a post 121 is formed through coating and patterning of the photoresist, selective etching of the silicon oxide layer, vapor deposition of the Au layer, and a lift-off process.

Referring to FIG. 15, after defining a region where the signal line 112 and the contact pad 134 overlaps each other through coding and patterning of the photoresist, a groove H is formed by etching the silicon oxide sacrificial layer having a pre-determined thickness.

Referring to FIG. 16, after defining a predetermined region through the coating and patterning of the photoresist, the moving plate 132 and the second hydrophilic layer 142 formed of $Al_2O_3$ having a strong hydrophilic property are formed by using the E-beam evaporation and the lift-off process.

Referring to FIG. 17, after defining a predetermined region through the coating and patterning of the photoresist, the Au upper electrode 133 and the contact pad 134 are formed by using the E-beam evaporation and the lift-off process.

Referring to FIG. 18, the silicon oxide sacrificial layer 122 is removed by using the HF vapor-phase etching process. The HF vapor-phase etching process is performed by using a mixture of the HF reaction gas, the alcoholic catalytic gas ($CH_3OH$, $C_2H_5OH$, etc.) and carrier gas for carrying the catalytic gas ($N_2$, Ar, etc.) et the temperature between about 25 and 45° C. Herein, an etching hole, which is not shown in FIGS. 10 through 18, may be formed in the moving plate 132 and the Au upper electrode 133 to facilitate removing of the silicon oxide sacrificial layer 122.

COMPARATIVE EXAMPLE

An experiment was conducted with the foregoing micro-mechanical switch manufactured on a real scale to observe the adhesion phenomenon of the micro-mechanical structures. Each of FIGS. 19 and 20 illustrates a plan picture and a graph obtained by a 3D surface profiling system of the micro-mechanical switch formed by using a hydrophilic layer and without using a hydrophilic layer respectively. The micro-mechanical switch having the hydrophilic layer had the same structure as that described with reference to FIGS. 8 and 9.

The detailed manufacturing conditions will be described with reference to FIG. 8. The substrate 111 was made of insulating gallium-arsenic (GaAs), the signal line 112 and the lower electrode 114 were of an Au thin film having the thickness of 0.5 μm, the moving plate 132 was of a Si thin film having the thickness of 0.3 μm, and the upper electrode 133 was of an Au thin film having the thickness of 0.9 μm. The thickness of the silicon oxide sacrificial layer 122 between the lower electrode 114 and the moving plate 132 was configured to be very thin, that is, 0.5 μm, so that the switch may have a low drive voltage. The first hydrophilic layer 141, which was made of aluminum of 0.05 μm thickness, was formed on the upper surface of the lower electrode 114 made of an Au thin film of 0.45 μm thickness. The second hydrophilic layer 142, which was made of aluminum oxide of 0.05 μm thickness, was formed on the bottom surface of the moving plate 132 made of a Si thin film of 0.25 μm thickness.

The graph in the lower part of FIG. 19 is the result of observing the switch by 3D surface profiling system, after removing a silicon oxide sacrificial layer through a HF vapor-phase etching process. As shown in the graph, the height from the surface of the lower electrode 114 to the surface of the upper electrode 133 was 2.0~5.1 μm, which is larger than the thickness 1.2 μm of the micro-mechanical structure in the shape of a cantilever comprising three layers of the second hydrophilic layer 142, the moving plate 132 and the upper electrode 133. That means that the micro-mechanical structure is being desirably released without any occurrence of adhesion. For reference, the appearance of the bent area in the graph is due to residual stress, which is not relevant with the present invention.

The micro-mechanical switch having no hydrophilic layer was manufactured in the same configuration with the above switch having a hydrophilic layer except the first and the second hydrophilic layer. Referring to FIG. 20, the height between the surfaces of the substrate 111 and the lower electrode 114 and the surface of the upper electrode 133 was 1.2 μm, which is equal to the sum of the thickness 0.3 μm of the moving plate 132 and the thickness 0.9 µm of the upper electrode 133. That means that the micro-mechanical structure, which is formed in the shape of a cantilever comprising two layers of the moving plate 132 and the upper electrode 133 formed on the moving plate.

The inventors of the present invention have observed the contact angle of water on the surface, after removing the sacrificial layer of by an etching process to find out the reason of an adhesion phenomenon of a micro-mechanical switch, while using the several materials for the sacrificial layer. As a result, it has been found that GaAs had 19° as the contact angle of water, Si and Au had 57° and 62° respectively. In other words, while GaAs has a strong hydrophilic property, Si and Au have a weak hydrophilic property. Therefore, when a silicon oxide sacrificial layer is removed by a HF vapor-phase etching process, a water bridge having the contact angle of less than 90° is likely to be produced between a GaAs substrate and a Si moving plate, between an Au lower electrode 114 and a Si moving plate 132, and between an Au signal line 112 and an Au contact pad 134. Especially, such a water bridge is very likely to be produced between a Si moving plate 132 and an Au lower electrode 114, the gap of which is relatively small and the facing area of which is relatively large. Therefore, the adhesion phenomenon of the switch occurs by the capillary force generated by the water bridge having the contact angle of less than 90°.

Meanwhile, the contact angles of Al, Ti and aluminum oxide were less than 90°, about 8°, about 5°, respectively. They had a strong hydrophilic property, and chemical stability not to be removed by the HF vapor-phase etching process. Therefore, in the micro-mechanical switch shown in FIG. 19, when a silicon oxide sacrificial layer is removed by the HF vapor-phase etching process, the water bridge in the liquid state is not produced because of the strong hydrophilic surface of the structure surrounding the silicon oxide sacrificial layer, and thereby the adhesion phenomenon does not occur.

As described above, according to the present invention, in a micro-mechanical structure released by removing a sacrificial layer, the adhesion phenomenon of a micro-mechanical structure in a removal process of the sacrificial layer can be prevented. Thereby, it is possible to decrease the gap between a base structure and a micro-mechanical structure, and thus the high yield of a micro-mechanical structure of superior characteristic is obtained.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

The invention claimed is:

1. A micro-mechanical structure released by removing a sacrificial layer, comprising:
    a first side portion fixed on one region of an upper surface of a base structure; and
    a second side portion released by removal of the sacrificial layer, the second side portion having an opposite surface to the upper surface, wherein the upper surface and the opposite surface include at least a hydrophilic surface to maintain a contact angle of water produced during removal of the sacrificial layer to be less than 90°, and to prevent the produced water from building up a water bridge which causes adhesion of the micro-mechanical structure.

2. The micro-mechanical structure according to claim 1, wherein the upper surface is a surface of a hydrophilic layer which is additionally formed on the base structure.

3. The micro-mechanical structure according to claim 1, wherein the opposite surface is a surface of a hydrophilic layer which is additionally formed on the micro-mechanical structure.

4. The micro-mechanical structure according to claim 2 or 3, wherein the hydrophilic layer has a thickness of 5~100 nm.

5. The micro-mechanical structure according to claim 1, wherein the upper surface and the opposite surface are formed of hydrophilic layers of materials equal to or different from each other.

6. The micro-mechanical structure according to claim 1, wherein the hydrophilic surface is formed of any one selected from the group consisting of aluminum (Al), titanium (Ti), chromium (Cr), iron (Fe), cobalt (Ca), aluminum oxide, chromium oxide, iron oxide, and cobalt oxide.

7. The micro-mechanical structure according to claim 1, wherein the sacrificial layer is formed of silicon oxide.

8. A method for manufacturing a micro-mechanical structure, comprising: providing a base structure having an upper surface;
    forming a sacrificial layer on the base structure;
    forming the micro-mechanical structure having a first side portion fixed on an upper surface of the base structure, and a second side portion to be released by removing the sacrificial layer, the second side portion having an opposite surface opposite to the upper surface; and
    releasing the micro-mechanical by removing the sacrificial layer, wherein the sacrificial layer is removed by etching in such a way that a contact angle of water produced during removal of the sacrificial layer is less than 90° on surfaces of the base structure and the micro-mechanical structure, and that the produced water does not build up a water bridge which causes adhesion of the micro-mechanical structure.

9. The method according to claim 8, wherein the sacrificial layer is formed of any one selected from a silicon oxide layer, a phosphosilicate glass (PSG) layer, and a boron-phosphorous-silicate glass (BPSG) layer, the silicon oxide layer including any one of thermal oxide, thermal chemical vapor deposition (CVD) oxide, plasma enhanced chemical vapor deposition (PECVD) oxide, spin-on glass (SOG), sputtered oxide and evaporated oxide.

10. The method according to claim 9, wherein the sacrificial layer is etched at a temperature of about 25° and about 45° by a mixture of an HF reaction gas, an alcoholic catalytic gas and a carrier gas for carrying the catalytic gas.

11. The method according to claim 8, wherein the upper surface and the opposite surface are hydrophilic surfaces formed of materials equal to or different from each other, respectively.

12. The method according to claim 11, wherein the hydrophilic surface is formed of any one selected from the group consisting of aluminum (Al), titanium (Ti), chromium (Cr), iron (Fe), cobalt (Co), aluminum oxide, chromium oxide, iron oxide, and cobalt oxide.

13. The method according to claim 8, wherein the upper surface is a surface of a hydrophilic layer which is additionally formed on the base structure.

14. The method according to claim 10, wherein the opposite surface is a surface of a hydrophilic layer which is additionally formed on the micro-mechanical structure.

15. A micro-mechanical structure released by removing a sacrificial layer, comprising:
- a first side portion fixed on an upper surface of a base structure; and
- a second side portion released by removing the sacrificial layer, the second side portion having an opposite surface opposite to the upper surface, wherein at least one of the upper surface and the opposite surface further includes a hydrophilic layer formed of any one selected from the group consisting of aluminum (Al), titanium (Ti), chromium (Cr), iron (Fe), cobalt (Co).

16. The micro-mechanical structure according to claim 15, wherein the hydrophilic layer has a thickness of 5~100 nm.

* * * * *